United States Patent
Bhagavat et al.

(10) Patent No.: US 11,211,332 B2
(45) Date of Patent: *Dec. 28, 2021

(54) MOLDED DIE LAST CHIP COMBINATION

(71) Applicant: Advanced Micro Devices, Inc., Santa Clara, CA (US)

(72) Inventors: Milind S. Bhagavat, Los Altos, CA (US); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/778,815

(22) Filed: Jan. 31, 2020

(65) Prior Publication Data

US 2020/0168549 A1 May 28, 2020

Related U.S. Application Data

(63) Continuation of application No. 15/961,222, filed on Apr. 24, 2018, now Pat. No. 10,593,628.

(51) Int. Cl.
*H01L 23/498* (2006.01)
*H01L 23/538* (2006.01)
(Continued)

(52) U.S. Cl.
CPC ........ *H01L 23/5383* (2013.01); *H01L 21/481* (2013.01); *H01L 21/485* (2013.01);
(Continued)

(58) Field of Classification Search
CPC . H01L 21/481; H01L 21/485; H01L 21/4853; H01L 21/4857; H01L 21/486;
(Continued)

(56) References Cited

U.S. PATENT DOCUMENTS 5,353,498 A * 10/1994 Fillion ................ H01L 25/0657
29/840
5,998,243 A 12/1999 Odashima et al.
(Continued)

FOREIGN PATENT DOCUMENTS

| EP | 1909546 A1 | 4/2008 |
| WO | WO2006134914 A1 | 12/2006 |
| WO | WO 2017111957 | 6/2017 |

OTHER PUBLICATIONS

U.S. Appl. No. 16/458,094, filed Jun. 30, 2019, Bhagavat et al.
(Continued)

*Primary Examiner* — Herve-Louis Y Assouman

(57) ABSTRACT

Various multi-die arrangements and methods of manufacturing the same are disclosed. In one aspect, a method of manufacturing a semiconductor chip device is provided. A redistribution layer (RDL) structure is fabricated with a first side and second side opposite to the first side. An interconnect chip is mounted on the first side of the RDL structure. A first semiconductor chip and a second semiconductor chip are mounted on the second side of the RDL structure after mounting the interconnect chip. The RDL structure and the interconnect chip electrically connect the first semiconductor chip to the second semiconductor chip.

20 Claims, 4 Drawing Sheets

(51) Int. Cl.
  *H01L 21/48* (2006.01)
  *H01L 21/56* (2006.01)
  *H01L 25/065* (2006.01)
  *H01L 23/52* (2006.01)
  *H01L 25/00* (2006.01)
  *H01L 25/18* (2006.01)
  *H01L 23/522* (2006.01)
  *H01L 23/31* (2006.01)
  *H01L 23/00* (2006.01)

(52) U.S. Cl.
  CPC ........ *H01L 21/486* (2013.01); *H01L 21/4853* (2013.01); *H01L 21/4857* (2013.01); *H01L 21/563* (2013.01); *H01L 23/49822* (2013.01); *H01L 23/49827* (2013.01); *H01L 23/49833* (2013.01); *H01L 23/49838* (2013.01); *H01L 23/49844* (2013.01); *H01L 23/522* (2013.01); *H01L 23/5382* (2013.01); *H01L 23/5386* (2013.01); *H01L 25/18* (2013.01); *H01L 25/50* (2013.01); *H01L 23/3185* (2013.01); *H01L 23/49811* (2013.01); *H01L 23/52* (2013.01); *H01L 23/538* (2013.01); *H01L 24/16* (2013.01); *H01L 2224/16227* (2013.01)

(58) Field of Classification Search
  CPC ............... H01L 21/563; H01L 23/5383; H01L 23/49822; H01L 23/49827; H01L 23/49833; H01L 23/49838; H01L 23/49844; H01L 23/522; H01L 23/5382; H01L 23/5386; H01L 25/18; H01L 25/50
  See application file for complete search history.

(56) References Cited

U.S. PATENT DOCUMENTS

| | | | |
|---|---|---|---|
| 6,258,626 B1 | 7/2001 | Wang et al. | |
| 6,339,254 B1 | 1/2002 | Venkateshwaran et al. | |
| 6,468,833 B2 | 10/2002 | Uner et al. | |
| 6,576,540 B2 | 6/2003 | Hsu et al. | |
| 6,583,502 B2 | 6/2003 | Lee et al. | |
| 6,593,662 B1 | 7/2003 | Pu et al. | |
| 6,717,253 B2 | 4/2004 | Yang | |
| 6,820,329 B2 | 11/2004 | Fang | |
| 6,853,064 B2 | 2/2005 | Bolken et al. | |
| 6,853,084 B2 | 2/2005 | Hsu et al. | |
| 6,916,685 B2 | 7/2005 | Yang et al. | |
| 7,041,591 B1 | 5/2006 | Lee et al. | |
| 7,057,277 B2 | 6/2006 | Chen et al. | |
| 7,081,402 B2 | 7/2006 | Hsu et al. | |
| 7,109,576 B2 | 9/2006 | Bolken et al. | |
| 7,198,980 B2 | 4/2007 | Jiang et al. | |
| 7,396,753 B2 | 7/2008 | Chu et al. | |
| 7,399,399 B2 | 7/2008 | Chou et al. | |
| 7,485,970 B2 | 2/2009 | Hsu et al. | |
| 7,528,474 B2 | 5/2009 | Lee | |
| 7,545,048 B2 | 6/2009 | Meyer et al. | |
| 7,554,203 B2 | 6/2009 | Zhou et al. | |
| 7,799,608 B2 | 9/2010 | Chan et al. | |
| 8,298,945 B2 | 10/2012 | Leung et al. | |
| 8,901,748 B2* | 12/2014 | Manusharow | H01L 23/5386 257/777 |
| 8,946,900 B2 | 2/2015 | Qian et al. | |
| 9,059,179 B2* | 6/2015 | Karikalan | H01L 24/49 |
| 9,223,541 B2 | 12/2015 | Barakat | |
| 9,240,377 B2 | 1/2016 | Qian et al. | |
| 9,324,687 B1 | 4/2016 | Kelkar et al. | |
| 9,443,824 B1* | 9/2016 | We | H01L 25/0652 |
| 9,542,522 B2* | 1/2017 | Qian | G06F 30/394 |
| 10,510,721 B2 | 12/2019 | Bhagavat et al. | |
| 10,593,628 B2* | 3/2020 | Bhagavat | H01L 21/481 |
| 2002/0006686 A1 | 1/2002 | Cloud et al. | |
| 2002/0172026 A1 | 11/2002 | Chong et al. | |
| 2003/0016133 A1 | 1/2003 | Egbert | |
| 2003/0111733 A1 | 6/2003 | Pogge et al. | |
| 2004/0106229 A1 | 6/2004 | Jiang et al. | |
| 2009/0135574 A1 | 5/2009 | Tanaka et al. | |
| 2010/0258944 A1* | 10/2010 | Uchiyama | H01L 24/82 257/773 |
| 2011/0010932 A1 | 1/2011 | Tanaka et al. | |
| 2011/0285006 A1 | 11/2011 | Weng et al. | |
| 2012/0007211 A1 | 1/2012 | Aleksov et al. | |
| 2012/0056312 A1* | 3/2012 | Pagaila | H01L 21/561 257/684 |
| 2012/0110217 A1 | 5/2012 | Christiansen et al. | |
| 2012/0286419 A1* | 11/2012 | Kwon | H01L 25/0657 257/737 |
| 2013/0049127 A1 | 2/2013 | Chen et al. | |
| 2013/0168854 A1 | 7/2013 | Karikalan et al. | |
| 2014/0102768 A1 | 4/2014 | Shizuno et al. | |
| 2014/0159228 A1 | 6/2014 | Teh et al. | |
| 2014/0185264 A1 | 7/2014 | Chen et al. | |
| 2014/0264791 A1 | 9/2014 | Manusharow et al. | |
| 2014/0264831 A1 | 9/2014 | Meyer | |
| 2014/0332966 A1 | 11/2014 | Xiu et al. | |
| 2015/0001717 A1 | 1/2015 | Karhade et al. | |
| 2015/0001733 A1 | 1/2015 | Karhade et al. | |
| 2015/0048515 A1 | 2/2015 | Zhang et al. | |
| 2015/0092378 A1 | 4/2015 | Roy et al. | |
| 2015/0171015 A1 | 6/2015 | Mahajan et al. | |
| 2015/0181157 A1 | 6/2015 | Kuo et al. | |
| 2015/0228583 A1 | 8/2015 | Karhade et al. | |
| 2015/0311182 A1 | 10/2015 | Lee et al. | |
| 2015/0318262 A1* | 11/2015 | Gu | H01L 25/0655 257/738 |
| 2015/0340459 A1 | 11/2015 | Lee | |
| 2016/0085899 A1 | 3/2016 | Qian et al. | |
| 2016/0133571 A1 | 5/2016 | Lee et al. | |
| 2016/0181189 A1 | 6/2016 | Qian et al. | |
| 2016/0293581 A1* | 10/2016 | Lin | H01L 24/20 |
| 2017/0207204 A1 | 7/2017 | Lin et al. | |
| 2019/0020343 A1 | 1/2019 | Lee et al. | |
| 2019/0051621 A1 | 2/2019 | Liu et al. | |
| 2019/0051633 A1 | 2/2019 | Bhagavat et al. | |
| 2019/0164936 A1 | 5/2019 | Agarwal et al. | |

OTHER PUBLICATIONS

Tom Krazit; *Intel shows off 80-core processor*; http://news.com.com/Intel+shows+off+80-core+processor/2100-1006_3; Feb. 11, 2007; pp. 1-3.
Ron Huemoeller et al.; *Silicon wafer integrated fan-out technology*; ChipScaleReview.com; Mar./Apr. 2015; pp. 1-4.
USPTO Office Action notification dated Apr. 30, 2018; U.S. Appl. No. 15/675,214.
USPTO Office Action notification dated Sep. 20, 2018; U.S. Appl. No. 15/675,214.
USPTO Office Action notification dated Jan. 30, 2019; U.S. Appl. No. 15/675,214.
PCT/US2018/044342 International Search Report dated Nov. 30, 2018.
Wikipedia; *Physical Layer*; https://en.wikipedia.org/wiki/Physical_layer; Jan. 2015; pp. 1-5.
USPTO Office Action notification dated Jun. 24, 2020; U.S. Appl. No. 16/458,094.

* cited by examiner

MOLDED DIE LAST CHIP COMBINATION

This application is a continuation of Ser. No. 15/961,222, filed Apr. 24, 2018.

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventional 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
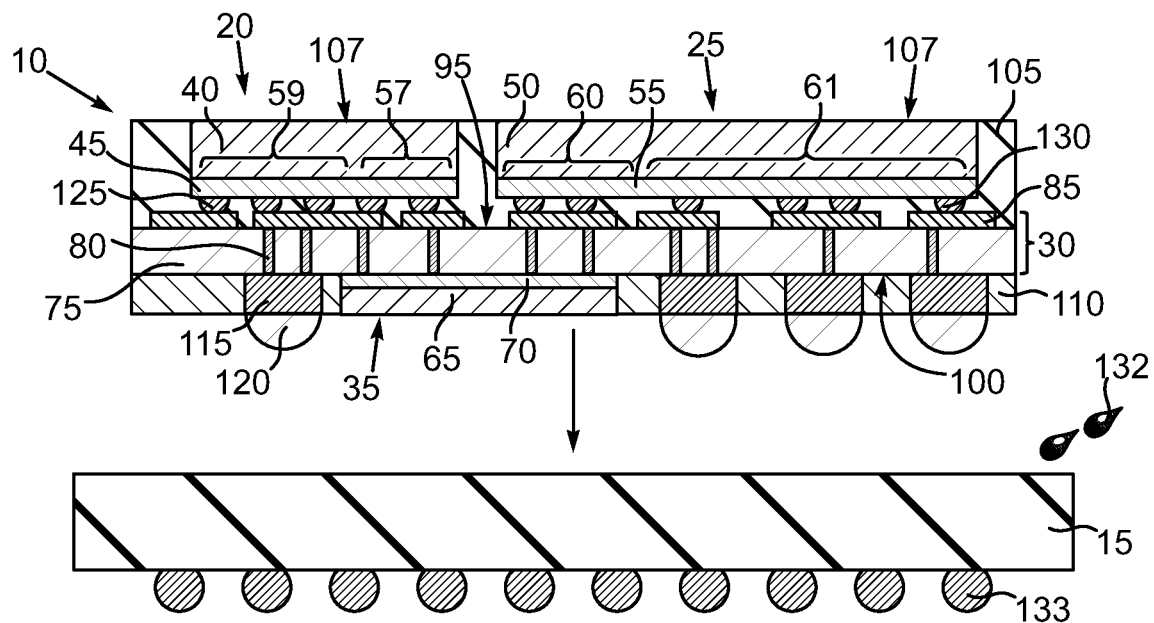
FIG. 1 is a sectional view of an exemplary molded multi-chip die last arrangement.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. Current 2D and 3D WLFO have limited minimum line spacing, on the order of 2.0 µm/line and space. In addition, conventional WLFO techniques use multiple low temperature cured polyimide films to create the requisite RDL layers. These low temperature polyimide films tend to be mechanical stress, and thus warpage, sources and their relatively high bake temperatures can adversely impact other sensitive devices. In addition, conventional techniques place the rather expensive fully fabricated chips in position prior to multiple later process steps to connect together the multiple chips. Finally, pick and place accuracy of chips in both WLFO and EMIB remains a challenge.

The disclosed arrangements utilize a die last process flow. In this way expensive fabricated dies are brought into a package at very near the end of package construction. Thus, any yield issues may be optically detected and will not result in the wasting of expensive dies. In addition, off the shelf types of chips, such as high bandwidth memory chips, can be used. The disclosed arrangements provide for conversion electrical pathways to and from existing processor interconnects. Thus, it is not necessary to change processor die interconnects, which otherwise require significant time and expense. The disclosed arrangements can use high temperature RDL dielectrics, since the multiple fabricated dies are mounted after RDL construction. Thus, temperature limits during RDL processing are removed and therefore so are the temperature associated limitations on the number of RDL layers.

In accordance with one aspect of the present invention, a method of manufacturing a semiconductor chip device is provided. A redistribution layer (RDL) structure is fabricated with a first side and second side opposite to the first side. An interconnect chip is mounted on the first side of the RDL structure. A first semiconductor chip and a second semiconductor chip are mounted on the second side of the RDL structure after mounting the interconnect chip. The RDL structure and the interconnect chip electrically connect the first semiconductor chip to the second semiconductor chip.

In accordance with another aspect of the present invention, a method of interconnecting a first semiconductor chip to a second semiconductor chip is provided. The method includes at least partially encasing an interconnect chip in a first molding layer. A redistribution layer (RDL) structure is fabricated on the first molding layer. A first semiconductor chip and a second semiconductor chip are mounted on the RDL structure after the RDL structure is fabricated. A first PHY region of the first semiconductor chip is interconnected to a second PHY region of the second semiconductor chip with the interconnect chip and the RDL structure.

In accordance with another aspect of the present invention, a semiconductor chip device is provided that includes a first molding layer, an interconnect chip at least partially encased in the first molding layer, and a redistribution layer (RDL) structure positioned on the first molding layer. The RDL structure has least one dielectric layer, plural conductor structures and a first side and second side opposite to the first side. A first semiconductor chip and a second semiconductor chip are positioned on the second side of the RDL structure after mounting the interconnect chip. The RDL structure and the interconnect chip electrically connect the first semiconductor chip to the second semiconductor chip. A second molding layer at least partially encases the first semiconductor chip and the second semiconductor chip.

In the drawings described below, reference numerals are generally repeated where identical elements appear in more than one figure. Turning now to the drawings, and in particular to FIG. 1 which is a sectional view of an exemplary semiconductor chip device 10 that can be mounted on another device such as a circuit board 15. As described in more detail below, the semiconductor chip device 10 can be constructed using a die-last type process flow. The semiconductor chip device 10 can include two or more semiconductor chips 20 and 25 that are mounted on and electrically interconnected by a RDL structure 30 and an interconnect chip 35. The semiconductor chips 20 and 25 can be any of a variety of integrated circuits. A non-exhaustive list of examples includes microprocessors, graphics processing units, application processing units that combines aspects of both, memory devices, an application integrated specific circuit or other. The semiconductor chip 20 includes a substrate portion 40 and an interconnect portion 45. The substrate portion 40 includes multitudes of logic and other circuits and can consist of silicon, germanium, or other types of semiconductor materials, and can include various dielectric materials. The interconnect portion 45 can consist of one or more layers of metallization and interlevel dielectric materials. The semiconductor chip 25 similarly consists of a substrate portion 50 and an interconnect portion 55. The semiconductor chip 20 is constructed with a physical device or "PHY" region 57, which has various internal and external conductor structures dedicated to the transmission of chip-to-chip signals, and a non-PHY region 59, which has conductor structures that are tailored more to the conveyance of power and ground and/or chip-to-circuit board signals. The semiconductor chip 25 similarly includes a PHY region 60 and a non-PHY region 61 that had the same functions as the PHY region 57 and the non-PHY region 59 of the semiconductor chip 20. As noted briefly above, the semiconductor chips 20 and 25 are connected electrically by way of another semiconductor chip, namely, an interconnect chip 35. The interconnect chip 35 includes a substrate portion 65 and an interconnect portion 70 that can be like the corresponding portions of the semiconductor chips 20 and 25. The semiconductor chips 20 and 25 and the interconnect chip 35 can be constructed of silicon, germanium or other semiconductor materials and be bulk semiconductor, semiconductor on insulator or other designs. The interconnect chip 35 includes multitudes of internal conductor traces (not visible), which can be on multiple levels or a single level as desired. The traces (not visible) interface electrically with conductor structures of the PHY regions 57 and 60 of the semiconductor chips 20 and 25 by way of conducting pathways. The interconnect portions 45, 55 and 70 of the semiconductor chips 20 and 25 and the interconnect chip 35, respectively, can have outermost passivation structures (not visible) that can be a laminate of various insulating materials such as, silicon dioxide, silicon nitride, or other dielectric materials.

The RDL structure 30 includes one or more dielectric layers, one of which is shown and labeled 75, and various metallization structures. The dielectric layer(s) 75 is preferably composed of polybenzoxazoles, although other polymeric materials could be used, such as benzocyclobutene, high or low temperature polyimide or other polymers. Since the RDL structure 30 is fabricated before the chips 20 and 25 are mounted thereon, polymer curing temperatures above 200° C. can be used. The dielectric layer(s) 75 is designed to act as a stress buffer, an isolation film and to enable redistribution layer routing. For example, the RDL structure 30 includes plural interconnect structures 80 and plural conductor structures 85 connected to some of the interconnect structures 80. The interconnect structures 80 can be pillars, vias or multitudes of vias and other types of interconnecting traces, etc. The conductor structures 85 can be conductor traces. However, the interconnect structures 80 and 85 are fabricated with design rules for small spacings associated with the I/O mappings of the chips 20 and 25. The interconnect portion 70 of the interconnect chip 35 is connected to some of the interconnect structures 80. The semiconductor chips 20 and 25 are mounted to a side 95 of the RDL structure 30. A molding layer 105 is formed on the side 95 of the RDL structure 30 and at least partially encases the semiconductor chips 20 and 25. The molding layer 105 surrounds the semiconductor chips 20 and 25 laterally but the respective upper surfaces 107 and 109 of the semiconductor chips 20 and 25 remain exposed to facilitate the subsequent optional placement of a heat spreader on the semiconductor chips 20 and 25. The opposite side 100 of the RDL structure 30 includes a molding layer 110 in which plural bump pads 115 are positioned. Plural conductor bumps 120 are metallurgically bonded to the bump pads 115. Many of the interconnect structures 80 of the RDL structure 30 are connected to various of the bump pads 115. Note that the bump pads 115 and the bumps 120 are fabricated with different design rules than the interconnect structures 80 and conductor structures 85 and thus are quite a bit larger than the interconnect structures 80 and conductor structures 85. However, the interconnect structures 80 provide a size transition interconnect system between the relatively large bump pads 115 and the much smaller interconnects associated with the semiconductor chips 20 and 25. In this regard, the semiconductor chip 20, and in particular the interconnect portion 45 thereof, is connected to the interconnect structures 80 directly or by way of the conductor structures 85 by plural interconnect structures 125, which can be solder bumps, micro bumps, metal pillars or others. The chip 25, and in particular the interconnect portion 55 thereof, is similarly connected to various of the conductor structure 85 by way of plural interconnect structures 130, which can be like the interconnect structures 125. It is desirable for the materials selected for the molding layers 105 and 110 to exhibit suitable viscosity at the applicable molding temperatures and have molding temperatures lower than the melting points of any of the solder structures present at the time of the molding processes. In an exemplary arrangement the materials for the molding layers 105 and 110 can have a molding temperature of about 165° C. Two commercial variants are Sumitomo EME-G750 and G760.

The interconnect structures 80, conductor structures 85, bump pads 115, and the various conductors of the interconnect portions 45, 55 and 70 of the semiconductor chips 20 and 25 and the interconnect chip 35, respectively, can be composed of various conductor materials, such as copper, aluminum, silver, gold, platinum, palladium or others. The solder bumps 120 and other solder structures disclosed herein (such as the interconnect structures 125 and 130) can be composed of various well-known solder compositions, such as tin-silver, tin-silver-copper or others.

The circuit board 15 can be organic or ceramic and single, or more commonly, multilayer. Variations include package substrates, system boards, daughter boards, circuit cards and others. To cushion against the effects of mismatched coefficients of thermal expansion, an underfill material 132 can be positioned between the molding layer 110 and the upper surface of the circuit board 15 and can extend laterally beyond the left and right edges (and those edges not visible) of the molding layer 110 as desired. The underfill material 132 can be composed of well-known polymeric underfill materials. The circuit board 15 can include I/Os 133 to interface with another device (not shown). The I/Os 133 can be solder balls or bumps, pins or others.

Figure 2:
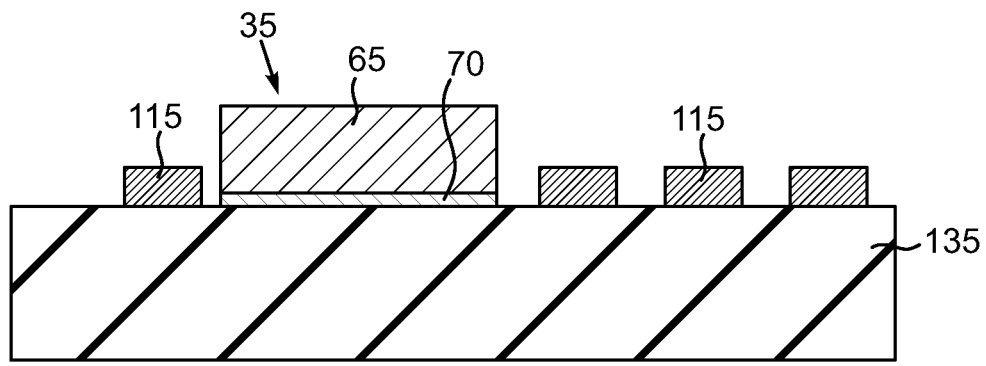
FIG. 2 is a sectional view depicting exemplary interconnect chip mounting and conductor manufacture on a carrier wafer.

An exemplary process flow for fabricating the semiconductor chip device 10 can be understood by referring now to FIGS. 2, 3, 4, 5, 6, 7, 8, 9 and 10 and initially to FIG. 2. The skilled artisan will appreciate that the semiconductor chip device 10 described herein can be fabricated as single units or en masse in a wafer-like structure (a reconstituted wafer) in what amounts to a wafer level process. Attention is now turned to FIG. 2, which is a sectional view depicting a temporary carrier wafer 135. The bump pads 115 depicted in FIG. 1 are initially patterned on the carrier wafer 135 using well-known plating or bulk material deposition and lithographic patterning and etching techniques. As noted above, these bump pads 115 will be used to subsequently create a converting pathway between the small gauge, small size interconnect structures 125 and 130 and the otherwise much larger conductor bumps 120. The carrier wafer 135 can be constructed of glass, silicon or other types of carrier wafer materials. The interconnect chip 35 is temporarily mounted with the interconnect portion 80 thereof facing downward (this is opposite to the orientation shown in FIG. 1) using an adhesive, such as a light or heat activated adhesive or a two sided tape or other type of joining technique that can be undone later.

Figure 3:
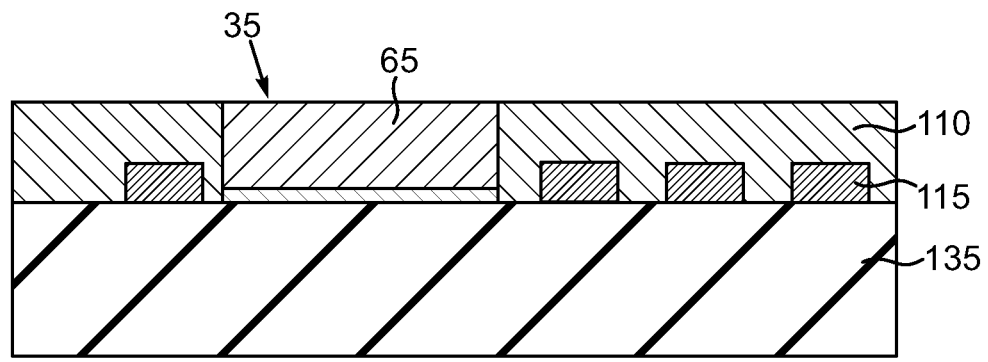
FIG. 3 is a sectional view like FIG. 2, but depicting exemplary molding of the interconnect chip.
Figure 4:
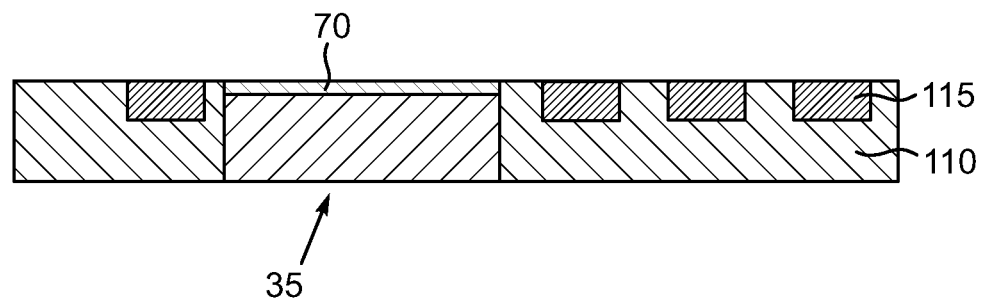
FIG. 4 is a sectional view like FIG. 3, but depicting carrier wafer removal.

Next and as shown in FIG. 3, the molding layer 110 is applied to the carrier wafer 135 over the bump pads 115 and the semiconductor chip 35 and then subsequently subjected to a grinding process to expose the substrate portion 65 of the semiconductor chip 35. At this point, the combination of the semiconductor chip 35, the molding layer 110 and the bump pads 115 makes up a reconstituted unit (or wafer if performed on a wafer level basis) that can be separated from the carrier wafer 135. Accordingly, and as shown in FIG. 4, the carrier wafer 135 is separated from the combination of the molding 110, the bump pads 115 and the semiconductor chip 35 using a process appropriate for the technique originally used to join the carrier wafer 135 to the interconnect chip 35. Thus, thermal release tapes or adhesives or perhaps some form of technique or a light activated adhesive can be used.

Figure 5:
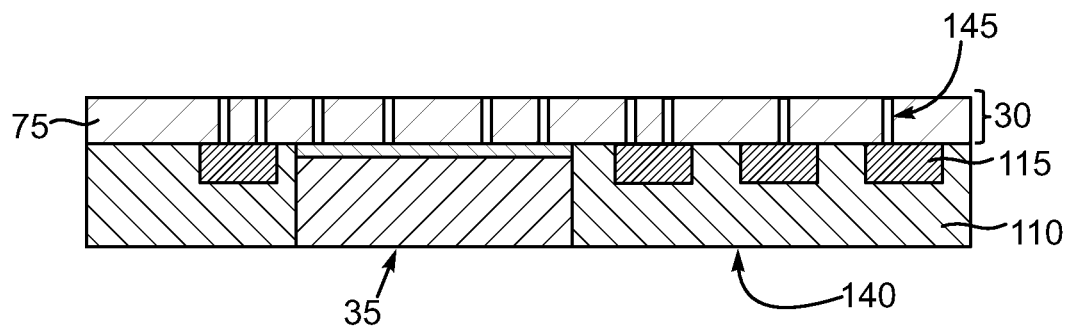
FIG. 5 is a sectional view like FIG. 4, but depicting exemplary RDL structure fabrication.

Next and as shown in FIG. 5, the RDL structure 30 undergoes fabrication on the combination of the molding layer 110, the bump pads 115 and the interconnect chip 35. Here the processing proceeds without a carrier substrate or wafer. However, in alternative arrangements, a carrier wafer or substrate can be temporarily mounted to the side 140 of the molding layer 110 for extra mechanical support. As noted above, the RDL structure 30 includes the dielectric layer(s) 75, which can be polybenzoxazoles (PBO), although other polymeric materials could be used, such as benzocyclobutene, low or high temperature polyimide or other polymers with a cure temperature of about 200° C. The dielectric layer(s) 75 is designed to act as a stress buffer, an isolation film and can enable redistribution layer routing. The isolating nature of the dielectric layer(s) 75 is important where the molding layer 110 is porous and would allow unwanted invasion of materials. The dielectric layer(s) 75 can be applied using well-known spin coating and baking techniques. In order to re-expose the bump pads 115, the dielectric layer(s) 75 can be suitably masked and lithographically patterned, that is, by way of photolithography, in order to establish openings 145 to the bump pads 115 where the interconnect structures 80 depicted in FIG. 1 will subsequently be formed.

Figure 6:
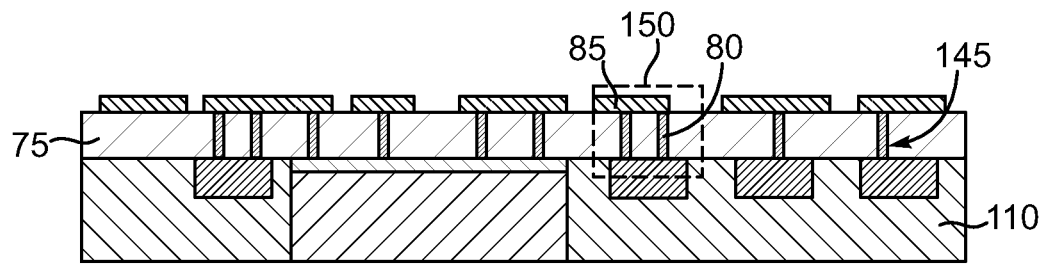
FIG. 6 is a sectional view like FIG. 5, but depicting additional exemplary RDL structure fabrication.
Figure 7:
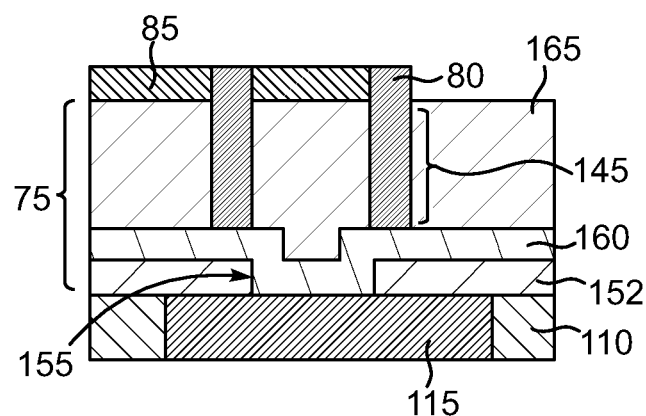
FIG. 7 is a portion of FIG. 6 shown at greater magnification.

Next and as shown in FIG. 6, the interconnect structures 80 are formed in the openings 145 of the dielectric layer(s) 75 using well-known plating, chemical vapor deposition (CVD), physical vapor deposition (PVD) or other types of techniques. Note the location of the dashed rectangle 150 in FIG. 6. The portion of FIG. 6 circumscribed by the dashed rectangle 150 is shown at greater magnification in FIG. 7. Note that because of the location of the dashed rectangle 150, portions of the molding layer 110 and one of the bump pads 115 as well as the dielectric layer(s) 75 and a couple of the interconnect structures 80 are depicted. As noted above, the dielectric layer(s) 75 can be composed of multiple layers. To this end and to facilitate connection between the interconnect structures 80 and the somewhat larger bump pad 115, initially a thin polymer layer 152 of PBO or polyimide or others can be deposited on the molding layer 110 over the bump pad 115. Thereafter a suitable opening 155 is formed in the polymer layer 152 that exposes a portion of the bump pad 115. Thereafter, a conductive RDL layer 160 is formed using well-known plating, CVD or PVD plus lithography or other types of techniques. Thereafter, another dielectric film 165 that, along with the dielectric film 152, makes up the dielectric layer(s) 75 in this arrangement is deposited on the RDL layer 160. Thereafter the aforementioned openings 145 are formed in the dielectric film 165 leading to the RDL layer 160. Thereafter, the interconnect structures 80 are formed partially in the dielectric film 165 but partially projecting away therefrom. This process may entail a suitable masking and plating processes. One of the processes is used to establish the vertically extending interconnect structures 80 and another process to establish laterally extending traces or conductors 85. The two masking and plating processes create not only the vertically extending interconnect structures 80 but also any laterally extending interconnect structures 85 routing to, for example, interconnect structures 80 that connect down to the interconnect chip 35 depicted in FIGS. 5 and 6 for example. For example, those of the interconnect structures 80 that are slated to connect to the interconnects 125 and 130 of the chips 20 and 25 shown in FIG. 1 can be fashioned as upwardly projecting pillar structures as shown in FIG. 7.

Figure 8:
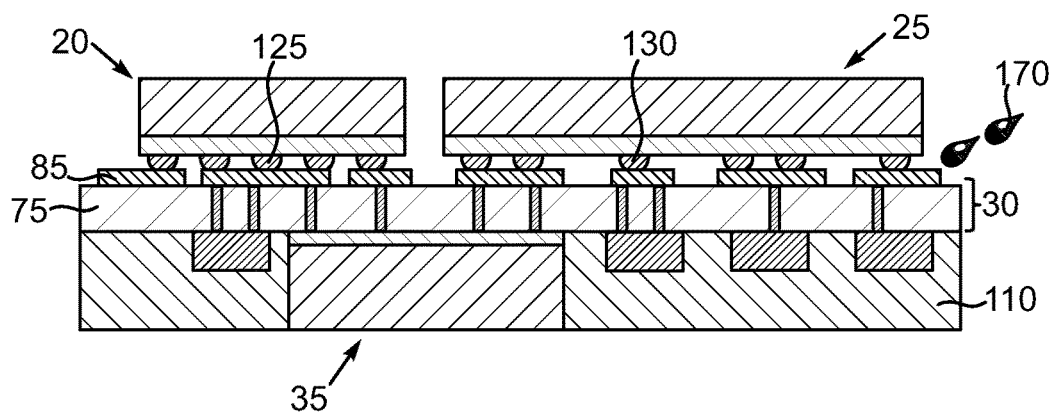
FIG. 8 is a sectional view like FIG. 6, but depicting exemplary multi-chip mounting on the RDL structure.

Next and as shown in FIG. 8, the semiconductor chips 20 and 25 are mounted on the conductor structures 85 of the RDL structure 30 using the interconnects 125 and 130. The semiconductor chips 20 and 25 are preferably verified as known good die prior to mounting. As noted above, the conductor structures 85 can be traces or just the tops of the interconnect structures 80. If the interconnects 125 and 130 are constructed of solder bumps then this entails simply placing the chips 20 and 25 and performing a reflow to establish metallurgical bonds between the interconnects 125 and 130 and the conductor structures 85. If desired, an optional underfill 170 can be dispensed between the chips 20 and 25 and the dielectric layer 60 to cushion the effects of differences in coefficient of thermal expansion between the chips 20 and 25 and the RDL structure 30. The underfill 170 can be a capillary or molded underfill. Note that at this stage, and in the stages depicted in FIGS. 3 and 4, the interconnect chip 35 and the molding layer 110 have not undergone a thinning process.

Figure 9:
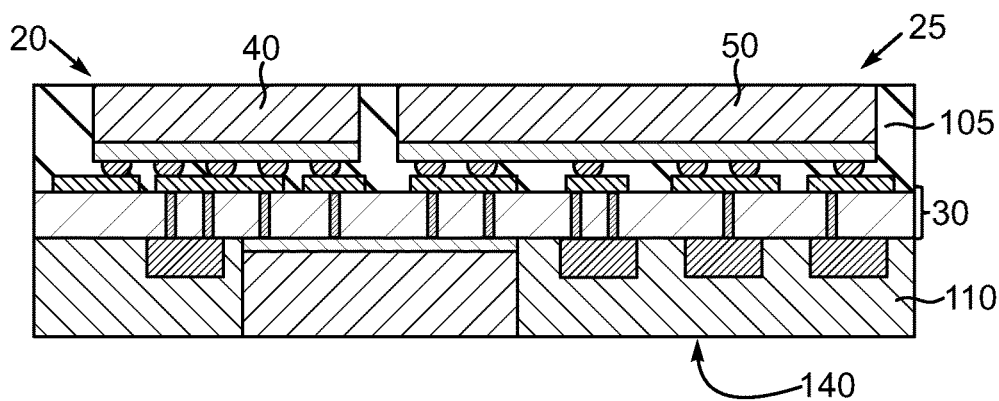
FIG. 9 is a sectional view like FIG. 8, but depicting exemplary molding of the multiple chips.

Next and as shown in FIG. 9, the molding layer 105 is applied on the RDL structure 30 and over the chips 20 and 25. The molding layer 105 is subsequently ground down to expose the substrate portions 40 and 50 of the semiconductor chips 20 and 25, respectively, and if desired to thin those substrate portions 40 and 50 to some desired z-height. As noted above, an optional carrier wafer (not shown) can be coupled to the side 140 of the molding layer 110 at this stage.

Figure 10:
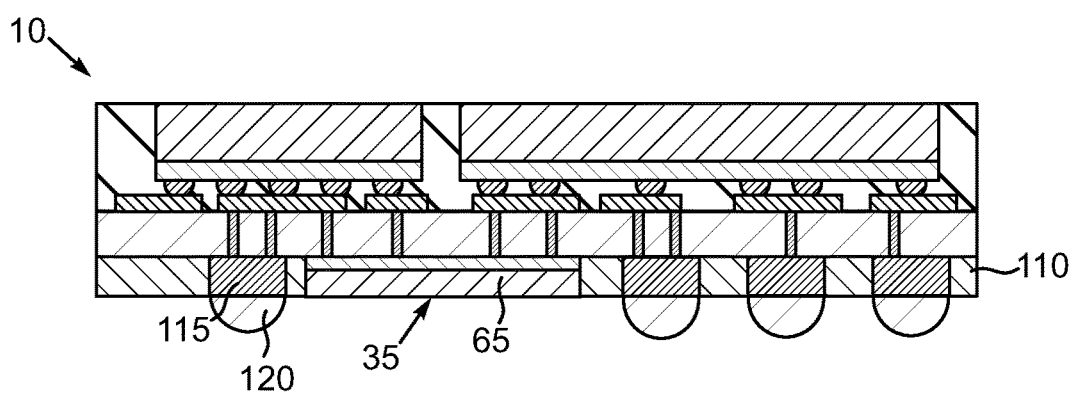
FIG. 10 is a sectional view like FIG. 9, but depicting exemplary molding layer and interconnect chip thinning.

Finally and as shown in FIG. 10, the molding layer 110 and the substrate portion 65 of the interconnect chip 35 can undergo a thinning process by grinding such that the bump pads 115 are exposed. Thereafter, the conductor bumps 120 can be applied to the bump pads 115 using well-known solder plating, pick and place or printing and reflow techniques. At this stage, the semiconductor chip device 10 is complete and ready to be mounted to the circuit board shown in FIG. 1.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing a semiconductor chip device, comprising:
   at least partially encasing an interconnect chip in a first molding layer;
   fabricating a redistribution layer (RDL) structure on the first molding layer after at least partially encasing the interconnect chip, the RDL structure having multiple dielectric layers, a first external side and a second external side opposite to the first external side, the first external side facing the interconnect chip;
   mounting a first semiconductor chip and a second semiconductor chip on the second external side of the RDL structure after fabricating the RDL structure, the RDL structure and the interconnect chip electrically connecting the first semiconductor chip to the second semiconductor chip; and
   at least partially encasing the first semiconductor chip and the second semiconductor chip in a second molding layer.

2. The method of claim 1, comprising mounting the interconnect chip on a carrier wafer prior to at least partially encasing it in the first molding layer.

3. The method of claim 2, comprising removing the carrier wafer before fabricating the RDL structure.

4. The method of claim 1, comprising thinning the first molding layer and the interconnect chip after at least partially encasing the first semiconductor chip and a second semiconductor chip in the second molding layer.

5. The method of claim 1, wherein the RDL structure includes a first plurality of interconnects to connect to a circuit board when the semiconductor chip device is mounted on the circuit board.

6. The method of claim 1, wherein the first semiconductor chip includes a first physical device (PHY) region connected to the interconnect chip and the second semiconductor chip includes a second PHY region connected to the interconnect chip.

7. The method of claim 1, comprising mounting a combination of the RDL structure, the interconnect chip, the first semiconductor chip and the second semiconductor chip on a circuit board.

8. The method of claim 1, wherein the first semiconductor chip comprises a processor and the second semiconductor chip comprises a memory chip.

9. The method of claim 1, comprising at least partially encasing plural bump pads in the first molding layer and thinning the first molding layer and the interconnect chip to expose the bump pads after at least partially encasing the first semiconductor chip and a second semiconductor chip in the second molding layer.

10. The method of claim 1, wherein the first semiconductor chip and the second semiconductor chip each includes an interconnect portion and a substrate portion, the method comprising grinding the second molding layer to expose the substrate portions.

11. A method of manufacturing a semiconductor chip device, comprising:
    at least partially encasing an interconnect chip in a first molding layer, the interconnect chip including an interconnect portion and a substrate portion;
    fabricating a redistribution layer (RDL) structure on the first molding layer after at least partially encasing the interconnect chip, the RDL structure having multiple dielectric layers, a first external side and a second external side opposite to the first external side, the first external side facing the interconnect chip and electrically connected to the interconnect portion of the interconnect chip;
    mounting a first semiconductor chip and a second semiconductor chip on the second external side of the RDL structure after fabricating the RDL structure, the RDL structure and the interconnect chip electrically connecting the first semiconductor chip to the second semiconductor chip; and
    at least partially encasing the first semiconductor chip and the second semiconductor chip in a second molding layer.

12. The method of claim 11, comprising mounting the substrate portion of the interconnect chip on a carrier wafer prior to at least partially encasing it in the first molding layer.

13. The method of claim 12, comprising removing the carrier wafer before fabricating the RDL structure.

14. The method of claim 11, comprising thinning the first molding layer and the interconnect chip after at least partially encasing the first semiconductor chip and a second semiconductor chip in the second molding layer.

15. The method of claim 11, wherein the RDL structure includes a first plurality of interconnects to connect to a circuit board when the semiconductor chip device is mounted on the circuit board.

16. The method of claim 11, wherein the first semiconductor chip includes a first physical device (PHY) region connected to the interconnect chip and the second semiconductor chip includes a second PHY region connected to the interconnect chip.

17. The method of claim 11, comprising mounting a combination of the RDL structure, the interconnect chip, the first semiconductor chip and the second semiconductor chip on a circuit board.

18. The method of claim 11, wherein the first semiconductor chip comprises a processor and the second semiconductor chip comprises a memory chip.

19. The method of claim 11, comprising at least partially encasing plural bump pads in the first molding layer and thinning the first molding layer and the interconnect chip to expose the bump pads after at least partially encasing the first semiconductor chip and a second semiconductor chip in the second molding layer.

20. A method of manufacturing a semiconductor chip device, comprising:
- at least partially encasing an interconnect chip and plural bump pads in a first molding layer;
- fabricating a redistribution layer (RDL) structure on the first molding layer after at least partially encasing the interconnect chip and the bump pads, the RDL structure having multiple dielectric layers, a first external side and a second external side opposite to the first external side, the first external side facing the interconnect chip;
- mounting a first semiconductor chip and a second semiconductor chip on the second external side of the RDL structure after fabricating the RDL structure, the RDL structure and the interconnect chip electrically connecting the first semiconductor chip to the second semiconductor chip;
- at least partially encasing the first semiconductor chip and the second semiconductor chip in a second molding layer; and
- coupling conductor bumps on the bump pads.

* * * * *